(12) United States Patent
Schumann (10) Patent No.: US 7,340,707 B2
(45) Date of Patent: Mar. 4, 2008

(54) AUTOMATIC TUNING OF SIGNAL TIMING

(75) Inventor: Reinhard Schumann, Exeter, NH (US)

(73) Assignee: Broadcom Corporation, Irvine, CA (US)

( * ) Notice: Subject to any disclaimer, the term of this patent is extended or adjusted under 35 U.S.C. 154(b) by 107 days.

(21) Appl. No.: 10/920,501

(22) Filed: Aug. 18, 2004

(65) Prior Publication Data

US 2005/0262459 A1  Nov. 24, 2005

Related U.S. Application Data

(60) Provisional application No. 60/573,150, filed on May 21, 2004.

(51) Int. Cl.
*G06F 17/50* (2006.01)
(52) U.S. Cl. .............................. 716/6; 716/5
(58) Field of Classification Search ................ 716/4–6
See application file for complete search history.

(56) References Cited

U.S. PATENT DOCUMENTS

| | | | |
|---|---|---|---|
| 6,370,676 B1* | 4/2002 | Hayashi et al. ................ | 716/6 |
| 6,618,836 B1* | 9/2003 | Pochmuller .................... | 716/4 |
| 6,763,489 B2* | 7/2004 | Nadeau-Dostie et al. ... | 714/731 |
| 6,990,644 B2* | 1/2006 | Feng .............................. | 716/6 |
| 7,020,862 B1* | 3/2006 | Alfke et al. .................... | 716/6 |
| 7,036,098 B2* | 4/2006 | Eleyan et al. .................. | 716/4 |
| 2003/0120989 A1* | 6/2003 | Zumkehr ..................... | 714/738 |
| 2005/0091562 A1* | 4/2005 | Krishnamoorthy et al. . | 714/724 |

* cited by examiner

*Primary Examiner*—Jack Chiang
*Assistant Examiner*—Binh Tat
(74) *Attorney, Agent, or Firm*—McAndrews, Held & Malloy, Ltd.

(57) ABSTRACT

A system and method for automatically tuning timing of a signal (e.g., a data timing signal) utilizing determined delay of a variable delay element and for utilizing such a tuned signal. Various aspects of the invention may comprise experimentally determining delay characteristics of an on-chip variable delay circuit utilizing an on-chip test module. A delay control signal for an on-chip variable delay circuit may be determined based at least in part on the experimentally determined delay characteristics. Timing of a signal may be adjusted by inputting the signal and the delay control signal into the on-chip variable delay circuit. The time-adjusted signal may then be utilized in signal processing. Such signal processing may, for example, comprise receiving an input data timing signal, generating a delayed input data timing signal, and generating an output data timing signal based on the input data timing signal and the delayed input data timing signal.

30 Claims, 6 Drawing Sheets

AUTOMATIC TUNING OF SIGNAL TIMING

CROSS-REFERENCE TO RELATED APPLICATIONS/INCORPORATION BY REFERENCE

This patent application is related to and claims priority from provisional patent application Ser. No. 60/573,150 filed May 21, 2004, and titled "AUTOMATIC TUNING OF SIGNAL TIMING," the contents of which are hereby incorporated herein by reference in their entirety.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Phase delays or temporal delays are utilized in a variety of electronic circuits. For example, an electronic circuit may receive a timing signal and adjust the timing or phase of such a timing signal for subsequent signal processing. An electronic circuit may utilize a timing adjustment sub-circuit to effect a temporal or phase adjustment for such a timing signal.

In various scenarios, the response of such a timing adjustment sub-circuit to a timing adjustment command may not be known to a desired degree of accuracy. For example and without limitation, manufacturing process variability may cause similarly designed circuits to behave differently. Also for example, operating condition variability may cause a circuit to behave differently at different times.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Various aspects of the present invention provide a system and method for tuning the timing of a signal (e.g., a data timing signal) utilizing determined delay of a variable delay element, and for utilizing such a tuned signal for signal processing.

Delay characteristics of an on-chip variable delay circuit may, for example, be determined utilizing an on-chip test module. The on-chip test module may, for example, be integrated with the on-chip variable delay circuit. Alternatively, for example, the on-chip test module may be independent of the on-chip variable delay circuit. Such an independent on-chip test module may, for example, be spatially positioned on the integrated circuit chip relatively near the on-chip variable delay circuit. For example, the on-chip test module may comprise one or more delay elements having an architecture similar to one or more delay elements in the on-chip variable delay circuit.

Delay characteristics may, for example, be experimentally determined by inputting a test signal to the on-chip test module and processing the test signal with the on-chip test module for a known test duration. The results of processing the test signal with the on-chip test module for the known duration may be analyzed to determine delay characteristics. The experimentally determined delay characteristics may, for example, comprise information of a number of fixed delay periods with which the on-chip test circuit delayed the test signal during the known test duration (i.e., the number of fixed delay periods elapsed during the test duration).

Further for example, delay characteristics may be experimentally determined by inputting a test signal to the on-chip test module and inputting a test delay control signal to the on-chip test module. The test signal may be processed by the on-chip test module in accordance with the test delay control signal to produce a delayed test signal and/or a related output signal. A plurality of such delayed test signals and/or related output signals corresponding to a plurality of test delay control signals may be generated and analyzed to determine a test delay control signal that delays the test signal by a target amount. A test delay control signal may, for example, be repeatedly modified and analyzed to determine a desired test delay control signal. The experimentally determined delay characteristics may, for example, comprise information of a test delay control signal that experimentally resulted in a test signal being delayed a target amount through the on-chip test module.

A delay control signal for an on-chip variable delay circuit may be determined based at least in part on the experimentally determined delay characteristics. For example, a delay control signal may be determined as a function of a test delay control signal that resulted in a target delay for the on-chip test module. Further for example, a delay control signal may be determined as a function of a number of fixed delay periods that elapsed during a known test duration. In an exemplary scenario involving delay of a data timing signal, determining a delay control signal may comprise determining a delay control signal that, when applied to the on-chip variable delay circuit, will result in the delayed data timing signal being offset from the original data timing signal by a quarter cycle of the original data timing signal. Such a determination may, of course, consider delays caused by other circuitry as well. For example and without limitation, in an exemplary scenario where subsequent circuitry may delay a signal by $1/20^{th}$ of a cycle, a variable delay of $1/5^{th}$ a cycle may be utilized to obtain an aggregate delay of $1/4^{th}$ a cycle.

Experimentally determining delay characteristics and determining a delay control signal may, for example, be performed automatically when an integrated circuit is initialized or may be performed on command.

Timing of a first signal may be adjusted by inputting the first signal and the delay control signal into the on-chip variable delay circuit. The time-adjusted signal may then be utilized in signal processing. In an exemplary data timing signal generating scenario, such signal processing may, for example, comprise receiving an input data timing signal, generating a delayed input data timing signal, and generating an output data timing signal as a function of the input data timing signal and the delayed input data timing signal.

These and other advantages, aspects and novel features of the present invention, as well as details of illustrative aspects thereof, will be more fully understood from the following description and drawings.

DETAILED DESCRIPTION OF THE INVENTION

Figure 1:
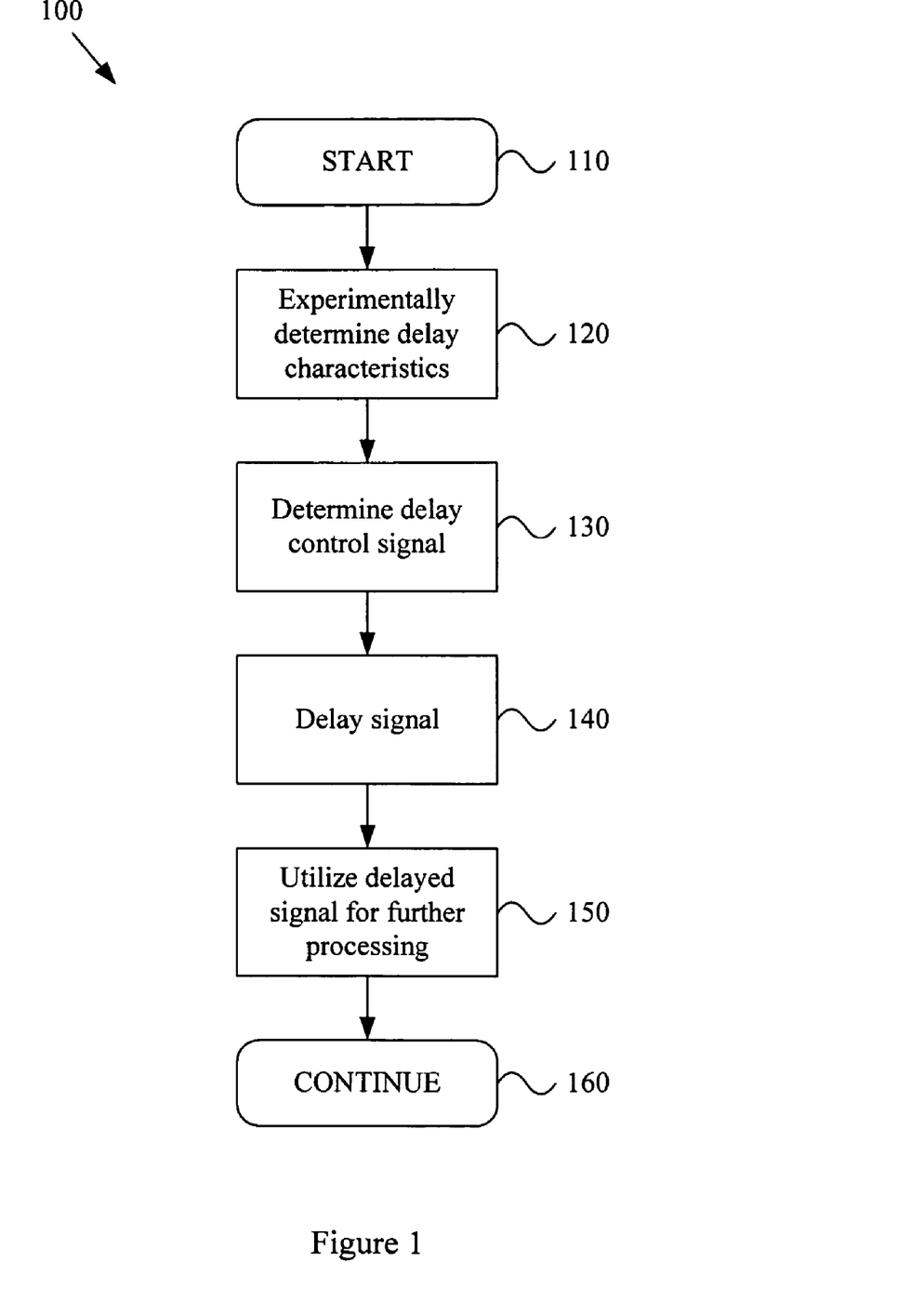
FIG. 1 is a flow diagram of a method for determining delay in a delay element and utilizing such a determination, in accordance with various aspects of the present invention.

FIG. 1 is a flow diagram of a method 100 for determining delay in a delay element and utilizing such a determination, in accordance with various aspects of the present invention. The method 100 may begin at step 110. The method 100 may be initiated for any of a large variety of reasons. For example, the method 100 may be initiated by powering up or resetting an electrical circuit or system. Also for example, the method 100 may be initiated by explicit command. Further for example, the method 100 may be initiated in response to a system fault or detected undesirable behavior. Accordingly, the scope of various aspects of the present invention should not be limited by characteristics of particular initiating events or conditions.

The method 100, at step 120, may comprise experimentally determining delay characteristics of an on-chip variable delay circuit utilizing an on-chip test module. The variable delay circuit may comprise any of a large variety of variable delay circuit architectures. For example, such a variable delay circuit may delay a signal utilizing analog and/or digital circuitry. For example and without limitation, such a variable delay circuit may comprise a variable number of logic gates or other circuit elements through which a signal may pass, each logic gate or other circuit element adding a delay to the signal. Such a variable delay circuit may, for example, receive a command signal to control delay characteristics of the variable delay circuit. For example, such a command signal may cause the signal that is to be delayed to traverse a particular path through the variable delay circuit.

Figure 9:
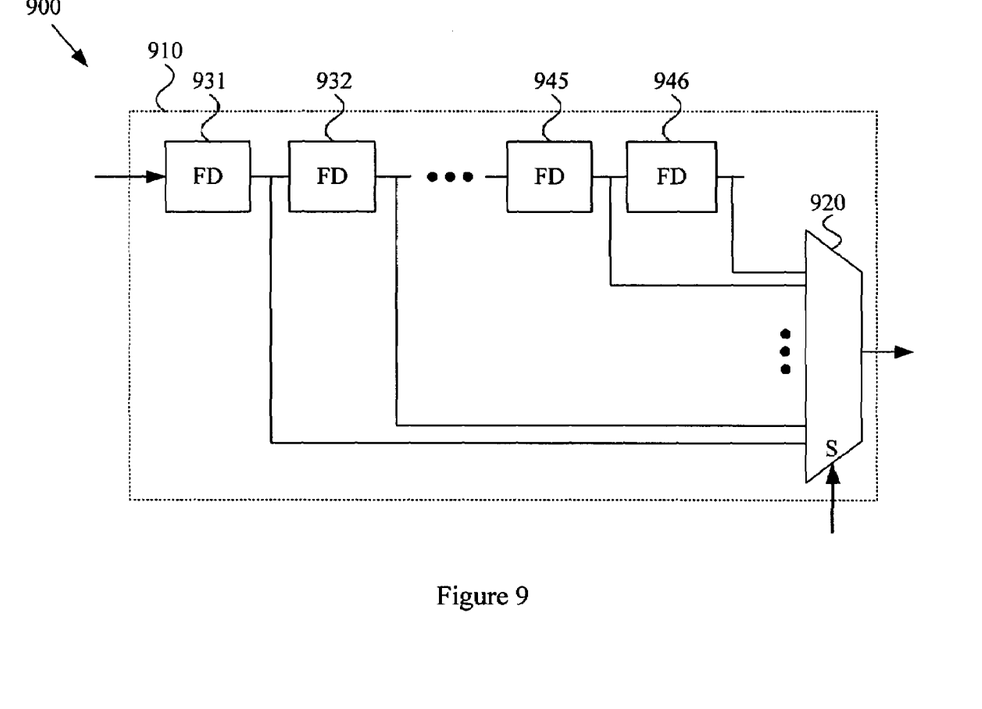
FIG. 9 is a drawing of an exemplary variable delay circuit, in accordance with various aspects of the present invention.

FIG. 9 provides a drawing 900 of an exemplary variable delay circuit 910. The exemplary variable delay circuit 910 may comprise a series of delay circuits 931-946 (e.g., sixteen delay circuits) through which delayed versions of an input signal to the variable delay circuit 910 may pass. For example, an input signal to the variable delay circuit 910 may be input to the first delay circuit 931. The first delay circuit 931 may, in turn, output a once-delayed version of the input signal, which may be provided to an input of a multiplexer 920 and to an input of the second delay circuit 932. The second delay circuit 932 may, in turn, output a twice-delayed version of the input signal, which may be provided to an input of the multiplexer 920 and an input of a third delay circuit, and so on. The multiplexer 920 is thus provided with a set of delayed versions of the input signal, each delayed by a respective number of fixed delay periods. The signal input to the select line of the multiplexer 920 may then determine which of the delayed versions of the input signal is output from the variable delay circuit 910. It is stressed that the exemplary variable delay circuit 910 is merely exemplary, and accordingly, the scope of various aspects of the present invention should not be limited by characteristics of the exemplary variable delay circuit 910.

The on-chip test module may comprise any of a large number of test circuit architectures. For example, the on-chip test module may be integrated with the on-chip variable delay circuit or may be an independent circuit. The on-chip test module may, for example, utilize hardware and/or software. The on-chip test module may, for example, comprise delay circuitry that is substantially similar to delay circuitry used in the on-chip variable delay circuit. The on-chip test module may, for example, be spatially positioned on an integrated circuit substantially near the on-chip variable delay circuit (e.g., substantially near the on-chip variable delay circuit relative to other circuitry on the integrated circuit). Such positioning may, for example, reduce effects of cross-chip manufacturing process variation.

In general, step 120 may comprise experimentally determining delay characteristics of an on-chip variable delay circuit utilizing an on-chip test module. Accordingly, the scope of various aspects of the present invention should not be limited by characteristics of particular variable delay circuitry or test circuitry.

Step 120 may comprise inputting a test signal to the on-chip test module. Such a test signal may, for example, comprise a step signal, pulse signal, clock signal or other periodic or non-periodic signal. For example and without limitation, such a test signal may comprise at least a portion of a signal to be delayed by the on-chip variable delay circuit.

Step 120 may, for example, comprise inputting a test duration control signal that dictates the duration of the test. Step 120 may then, for example, process the input test signal (e.g., utilizing fixed delay elements) for the duration of the test. For example, the on-chip test module may delay the input test signal a particular number of fixed delay periods during the test duration.

Step 120 may alternatively, for example, comprise inputting a test delay control signal to the on-chip test module. Such a test delay control signal may, for example, comprise a command to the on-chip test module to delay the test signal by an amount. For example and without limitation, an on-chip test module may respond to a set of N discrete test delay control signals by delaying the test signal N respective amounts. The test delay control signal may, for example, be generated with discrete hardware, a processor executing software instructions, or a combination thereof. Step 120 may further, for example, comprise processing the test signal with the on-chip test module in accordance with the test delay control signal to produce a delayed test signal.

As mentioned previously, the on-chip test module may comprise any of a large variety of test circuit architectures. A non-limiting aspect of an exemplary on-chip test module will be discussed later in the discussion related to FIG. 4.

Step 120 may additionally, for example, comprise determining the delay of the test signal. Such a delay determination may comprise determining an absolute or relative delay. For example, the delay determination may comprise comparing the timing (or phase) of the delayed test signal to another signal. In an exemplary scenario, step 120 may comprise comparing the timing of the delayed test signal to the timing of the original test signal. Step 120 may, for example, comprise comparing a difference in timing of a test signal and corresponding delayed test signal to a third signal (e.g., a test duration signal or clock signal).

Step 120 may, for example, comprise comparing delay caused by the on-chip test module to a target delay. Such a target delay may be expressed in any of a variety of ways, including, for example, a time duration, a phase angle, a portion of a known time duration, a portion or multiple of the period of a periodic waveform, etc. Step 120 may then, for example, comprise generating a signal indicative of the results of such a comparison. Such a generated signal may comprise an analog or digital signal (e.g., a binary or higher resolution signal).

In an exemplary scenario, step 120 may comprise comparing a difference in timing of a test signal and corresponding delayed test signal to the duration of one cycle of a periodic signal to be delayed by the variable delay circuit. For example and without limitation, in a scenario where the variable delay circuit is to delay a periodic input signal by a portion or multiple of one cycle, step 120 may comprise comparing a difference in timing of a test signal and corresponding delayed test signal to the duration of one cycle of the periodic input signal.

Step 120 may also, for example, comprise modifying the test delay control signal to determine a test delay control signal that delays the test signal by a target amount (or target range). Such a target amount may be, for example, an absolute value or relative value. For example and without limitation, a target amount may be expressed in terms of a portion or multiple of a periodic waveform. At least a portion of the delay characteristics determined at step 120 may then, for example, comprise information of the test delay control signal that resulted in a delay of the test signal by the target amount.

For example and without limitation, in an exemplary scenario, a target amount may be one cycle of a periodic signal to be delayed by the on-chip variable delay circuit. In such an exemplary scenario, step 120 may comprise modifying the test delay control signal until it is determined that the delay caused by the on-chip test module is substantially similar to the target one-cycle duration.

The method 100, at step 130, may comprise determining a delay control signal based at least in part on the experimentally determined delay characteristics, wherein the delay control signal will cause the on-chip variable delay circuit to delay an input signal by a desired amount (e.g., target amount or range). For example, step 130 may comprise determining a delay control signal as a function of a test delay control signal that, in step 120, was found to result in a target delay for the on-chip test module.

For example, in an exemplary scenario where delay characteristics experimentally determined at step 120 comprise information of a test delay control signal resulting in an experimental target delay of the on-chip test module, step 130 may comprise determining a delay control signal for the on-chip variable delay circuit as a function of the ratio of desired delay in the on-chip variable delay circuit to the experimental target delay of the on-chip test module.

Also, for example, step 130 may comprise determining a delay control signal for the on-chip variable delay circuit as a function of the architecture of the on-chip variable delay circuit compared to the on-chip test module. For example and without limitation, an on-chip test module may have a portion or multiplicity of delay circuitry as contained in the on-chip variable delay circuit. As a basic example, in a scenario where the variable delay circuit comprises M variable delay elements in series, and the on-chip test module utilizes N of such variable delay elements in series, step 130 may comprise utilizing knowledge of the N:M ratio in determining the delay control signal for the on-chip variable delay circuit.

In general, step 130 may comprise determining a delay control signal based at least in part on the experimentally determined delay characteristics determined at step 120. Accordingly, the scope of various aspects of the present invention should not be limited by characteristics of particular delay characteristics, particular delay control signals, a particular relationship between experimentally determined delay characteristics and particular delay control signals, or particular method or apparatus for processing delay control signals.

The method, at step 140, may comprise adjusting the timing of (e.g., delaying) the first signal by inputting the first signal and the determined delay control signal to the on-chip variable delay circuit. The on-chip variable delay circuit may receive the first signal, which is to be delayed by the on-chip variable delay circuit, and the on-chip variable delay circuit may receive the delay control signal determined at step 140 to cause a desired delay behavior of the on-chip variable delay circuit. The on-chip variable delay circuit may then delay the first signal by an amount in accordance with the delay control signal.

The method, at step 150, may comprise utilizing the delayed first signal produced at step 140 for further processing. For example and without limitation, the delayed first signal may be utilized to control timing of further signal processing. The delayed first signal may, for example, be utilized to form other signals (e.g., a clock signal or data timing signal). In general, step 150 may comprise utilizing the delayed first signal for any of a large variety of subsequent signal processing. Accordingly, the scope of various aspects of the present invention should not be limited by characteristics of a particular signal processing utilization of the delayed first signal.

Figure 2:
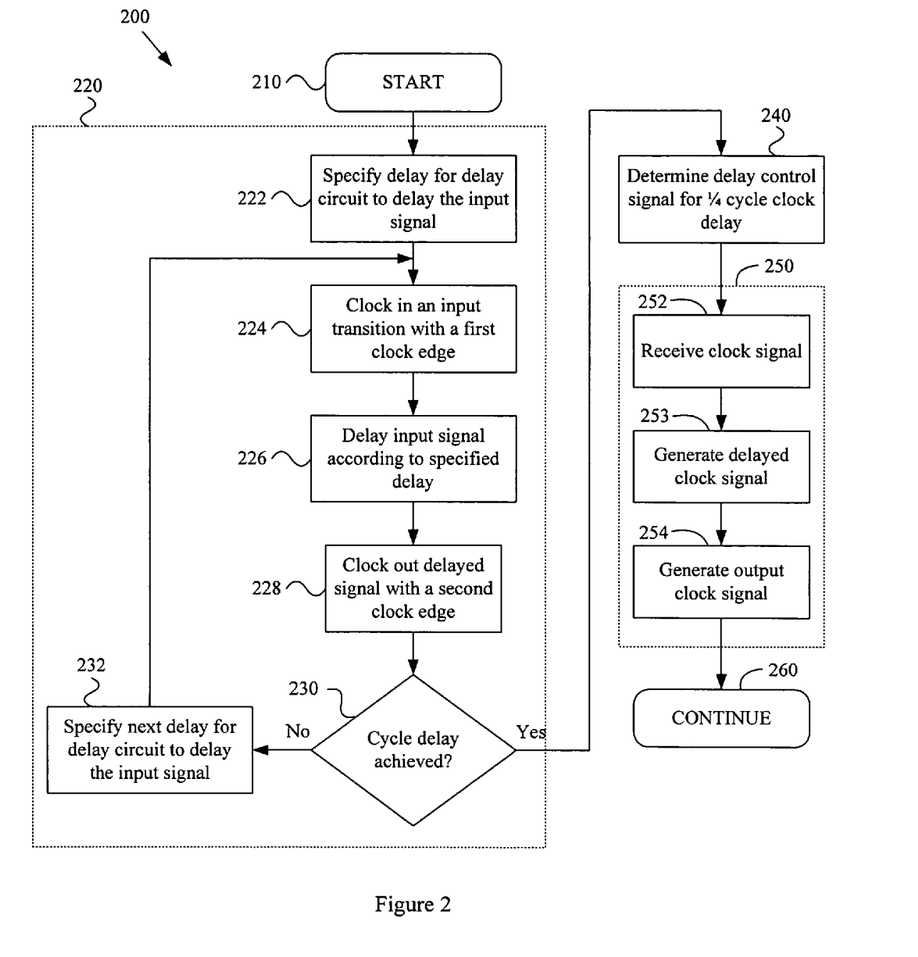
FIG. 2 is a flow diagram of a method for determining delay in a delay element and utilizing such a determination to generate a clock signal, in accordance with various aspects of the present invention.

FIG. 2 is a flow diagram of an exemplary method 200 for determining delay in a delay element and utilizing such a determination to generate a clock signal (or data timing signal), in accordance with various aspects of the present invention. It should be noted that the method 200 is merely exemplary, and accordingly, the scope of various aspects of the present invention should not be limited by characteristics of particular aspects (e.g., clock signal generation aspects) of the exemplary method 200.

The method 200 begins at step 210. The method 200 may be initiated for any of a large variety of reasons. For example, the method 200 may be initiated by powering up or resetting an electrical circuit or system. Also for example, the method 200 may be initiated by explicit command. Further for example, the method 200 may be initiated in response to a system fault or detected undesirable behavior.

Accordingly, the scope of various aspects of the present invention should not be limited by characteristics of particular initiating events or conditions.

The method, at step 220, may comprise experimentally determining delay characteristics of an on-chip variable delay circuit utilizing an on-chip test module. Step 220 may, for example, comprise various characteristics of step 120 of the method 100 illustrated in FIG. 1 and discussed previously. Step 220 may, for example, comprise a sequence of sub-steps 222-232, which step 220 may utilize to experimentally determine the delay characteristics.

The method 200, at step 222, may comprise specifying (or determining) a delay that the on-chip test module is to delay an input test signal. For example and without limitation, in an exemplary scenario where the on-chip test module may operate according to N test delay command signals, step 222 may comprise specifying an initial one of the N test delay command signals to utilize in experimentally determining delay characteristics of the on-chip variable delay circuit.

The method 200, at step 224, may comprise clocking in a test signal (e.g., a recently transitioned test signal) with a first clock edge of a clock signal. For example and without limitation, the clock signal may comprise or be based on the clock signal to be delayed by the on-chip variable delay circuit.

The method 200, at step 226, may comprise delaying the test signal according to a specified delay. The specified delay may, for example, comprise a specified command signal to the on-chip test module. Such a command signal may correspond to the delay specified at step 222, discussed previously, or may correspond to a delay specified at step 232, to be discussed below.

The method 200, at step 228, may comprise clocking out the delayed test signal from step 226 with a second clock edge of the clock signal. The second clock edge may, for example and without limitation, correspond to a clock edge of the clock signal immediately subsequent to the first clock edge utilized at step 224 (e.g., of a similar or different clock transition type). For example and without limitation, the second clock edge may correspond to a clock edge of the clock signal that occurs one cycle after the first clock edge utilized at step 224. Accordingly, the scope of various aspects of the present invention should not be limited by characteristics of a particular clock signal, clock edge or relationship between the first clock edge utilized at step 224 and the second clock edge utilized at step 228.

The method, at step 230, may comprise determining if a desired delay of the test signal by the on-chip test module has been achieved. For example and without limitation, in a scenario with a target delay of one clock cycle, step 230 may analyze the results of steps 224 and 228 to determine if the delay implemented at step 226 resulted in the target delay of one clock cycle. In an exemplary scenario, step 230 may determine if the logic value of the test signal clocked in at step 224 is equal to or different than the logic value of the delayed test signal clocked in at step 228. Such a determination may, for example, be utilized to determine if the test signal has been delayed at step 226 an amount less than or greater than the interval between the time that the test signal was clocked in at step 224 and the time that the delayed test signal was clocked out at step 228.

If step 230 determines that step 226 delayed the test signal a desired amount, then the method 200 execution may flow to step 240. If, however, step 230 determines that step 226 did not delay the test signal a desired amount, then method 200 execution may flow to step 232.

The method 200, at step 232, may specify a next experimental delay for the on-chip test module to delay a test signal. The method 200 execution may then flow back to step 224 for analysis to begin on the next specified delay. The loop formed by steps 224-232 may, for example, continue until step 230 determines that a desired test delay has been achieved.

In an alternative exemplary scenario, exemplary step 220 may comprise specifying all N experimental delays and analyzing the results of the N experimental delays to determine one or more of the N experimental delays that result in a target delay.

In another exemplary scenario, exemplary step 220 may comprise determining a number of fixed delay periods that occur during a test duration (e.g., as mentioned previously with regard to the exemplary method 100 illustrated in FIG. 1). For example and without limitation, step 220 may comprise determining how many fixed delay elements the test circuit may traverse during a test duration. Information of the test duration and number of fixed periods may then, for example, be utilized later to determine a delay control signal.

The method 200, at step 240, may comprise determining a delay control signal, based at least in part on the experimentally determined delay characteristics, to input to the on-chip variable delay circuit to achieve a desired delay. Step 240 may, for example and without limitation, comprise various characteristics of step 130 of the method 100 shown in FIG. 1 and discussed previously.

For example, step 240 may comprise converting the delay characteristics experimentally determined at step 220 to a delay control signal that, when applied to the on-chip variable delay circuit, will cause the on-chip variable delay circuit to delay an input signal a desired delay amount.

For example and without limitation, in an exemplary scenario where the input signal is a clock signal to be delayed by ¼ cycle, step 240 may comprise analyzing the experimentally determined delay characteristics from step 220 to determine a delay control signal to apply to the on-chip variable delay circuit to delay the input clock signal by ¼ cycle.

The method 200, at step 250, may comprise utilizing the control signal determined at step 240 for further signal processing. Step 250 may, for example and without limitation, comprise various aspects of step 150 of the method 100 illustrated in FIG. 1 and discussed previously. In the exemplary method 200, step 250 may comprise performing signal processing to generate a clock signal (or data timing signal). Note, however, that clock signal generation is but one example of further signal processing that may be performed utilizing the control signal determined at step 240. Accordingly, the scope of various aspects of the present invention should by no means be limited by characteristics of clock signal generation.

Step 250 may, for example, comprise sub-steps 252-254 that step 250 may utilize to generate a clock signal. Step 252 may comprise receiving a first clock signal at the on-chip variable delay circuit. Such a clock signal may, for example, comprise any of a large variety of timing signals, including periodic and non-periodic timing signals. In an exemplary scenario, step 252 may comprise receiving a DQS clock (or data timing) signal from a synchronous Dual Data Rate (DDR) RAM (or Quad Data Rate or DDR-II RAM in another exemplary scenario).

Step 253 may comprise generating a delayed first clock signal utilizing the on-chip variable delay circuit to delay the first clock signal according to the delay control signal determined at step 240. For example, step 253 may comprise delaying a periodic first clock signal by a portion or multiple of its period. Continuing the exemplary scenario, step 253 may comprise delaying the received DQS signal by ¼ cycle.

Step 254 may comprise generating the output clock signal as a function of the first clock signal and the delayed first clock signal. For example, step 254 may comprise inputting the first clock signal and the delayed first clock signal into a digital logic circuit to generate a composite output clock signal. Continuing the exemplary scenario, step 254 may comprise utilizing XOR or XNOR processing to convert the DQS input signal and the ¼-cycle-delayed DQS signal to a composite output clock signal with twice the frequency of the DQS signal and clock transitions during the middle of active data windows from the DDR RAM corresponding to the DQS signal.

Figure 3:
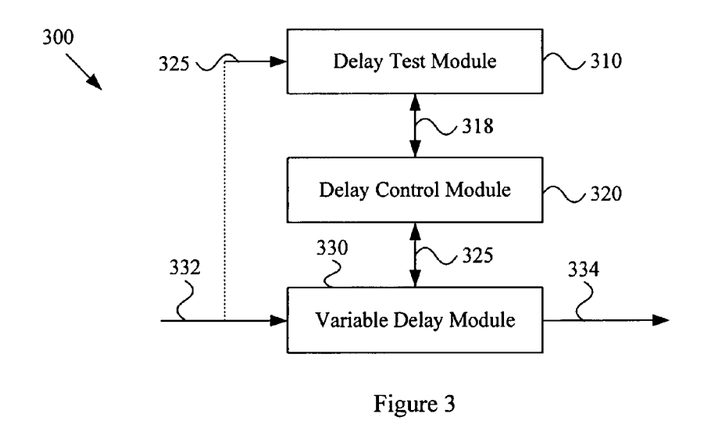
FIG. 3 is a diagram illustrating a signal timing adjustment module in an integrated circuit, in accordance with various aspects of the present invention.

FIG. 3 is a diagram illustrating a signal timing adjustment module 300 in an integrated circuit, in accordance with various aspects of the present invention. The signal timing adjustment module 300 may, for example and without limitation, perform various aspects of the exemplary methods 100, 200 illustrated in FIGS. 1-2 and discussed previously (e.g., steps 120-140 and steps 220-253).

The signal timing adjustment module 300 may comprise a delay test module 310, a delay control module 320, and a variable delay module 330. The delay control module 320 may generally communicate with the delay test module 310 to determine a delay control signal to communicate to the variable delay module 330. The variable delay module 330 may receive the delay control signal 325 from the delay control module 320 and an input signal 332 to be delayed, and output 334 the input signal delayed in accordance with characteristics of the delay control signal 325.

The following discussion will generally discuss various exemplary operational aspects of the signal timing adjustment module 300. Note, however, that the scope of various aspects of the present invention should not be limited by characteristics of the various exemplary operational aspects.

The signal timing adjustment module 300 may begin processing for any of a large variety of reasons. For example, the module 300 may begin processing upon power-up or reset. Also for example, the module 300 (or portion thereof) may begin various processing activities upon receipt of an explicit command from another system. Further for example, the module 300 may begin processing in response to a system fault or detected undesirable system behavior. Accordingly, the scope of various aspects of the present invention should not be limited by characteristics of particular initiating events or conditions.

The signal timing adjustment module 300 may experimentally determine delay characteristics of the variable delay module 330 utilizing the delay test module 310. The variable delay module 330 may comprise any of a large variety of variable delay circuit architectures. For example, the variable delay module 330 may delay a signal utilizing analog and/or digital circuitry. For example and without limitation, the variable delay module 330 may comprise a variable number of logic gates or other circuit elements through which an input signal 332 may pass, each logic gate or other circuit element adding a delay to the input signal.

The variable delay module 330 may, for example, receive a delay control signal 325 (e.g., from the delay control module 320) to control delay characteristics of the variable delay module 330. For example, such a delay control signal 325 may cause the variable delay module 330 to route the input signal 332 through a particular circuit path of the variable delay module 330.

The delay test module 310 may comprise any of a large number of test circuit architectures. For example, the delay test module 310 may be integrated with portions of the variable delay module 330 or may be an independent circuit. The delay test module 310 may, for example, utilize hardware and/or software. The delay test module 310 may, for example, comprise delay circuitry that is substantially similar to delay circuitry used in the variable delay module 330.

The delay test module 310 may, for example, be spatially positioned on an integrated circuit substantially near the variable delay module 330 (e.g., substantially near the variable delay module 330 relative to other circuitry on the integrated circuit). Such positioning may, for example, reduce effects of cross-chip manufacturing process variation. In other words, such positioning may provide for various components of the delay test module 310 behaving in a similar manner to corresponding various components of the variable delay module 330.

In general, the signal timing adjustment module 300 may experimentally determine delay characteristics of the variable delay module 330 utilizing the delay test module 310. Accordingly, the scope of various aspects of the present invention should not be limited by characteristics of particular variable delay circuitry or test circuitry.

The delay test module 310 may receive a test signal 312. The test signal 312 may, for example, comprise a step signal, pulse signal, clock signal or other periodic or non-periodic signal. For example and without limitation, the test signal 312 may comprise at least a portion of the input signal 332 to be delayed by the variable delay module 330. Alternatively, for example, the test signal 312 may comprise a test signal 312 generated independently of the input signal 332 to be delayed by the variable delay module 330.

The delay test module 310 may, for example, receive a test duration control signal that dictates the duration of the test. The delay test module 310 may then, for example, process the input test signal (e.g., utilizing fixed delay elements) for the duration of the test. For example, the on-chip test module may delay the input test signal a particular number of fixed delay periods during the test duration.

Alternatively, for example, the delay test module 310 may receive a test delay control signal 318 (e.g., from the delay control module 320 or internally generated). Such a test delay control signal 318 may, for example, comprise a command to the delay test module 310 to delay the test signal 312 by a corresponding amount. For example and without limitation, a delay test module 310 may respond to a set of N discrete test delay control signals 318 by delaying the test signal N respective amounts. The test delay control signal 318 may, for example, be generated with discrete hardware, a processor executing software instructions, or a combination thereof.

As explained previously, the source of the test signal 312 and/or the test delay control signal 318 may be from within the delay test module 310 or from another source (e.g., the delay control module 320). Accordingly, the scope of various aspects of the present invention should not be limited by characteristics of a particular source of the signals.

The delay test module 310 may, for example, process the test signal 312 in accordance with the test delay control signal 318 to produce a delayed test signal. As mentioned previously, the delay test module 310 may comprise any of a large variety of test circuit architectures. Various non-limiting aspects of an exemplary delay test module will be discussed later in the discussion related to FIG. 4.

The delay test module 310 may additionally, for example, determine the delay of the delayed test signal. Such a delay determination may comprise determining an absolute or relative delay. For example, the delay test module 310 may compare the timing (or phase) of the delayed test signal to another signal. In an exemplary scenario, the delay test module 310 may compare the timing of the delayed test signal to the timing of the original test signal 312. The delay test module 310 may, for example, compare a difference in timing of the test signal 312 and corresponding delayed test signal to a third signal (e.g., a test duration signal or clock signal).

The delay test module 310 (or delay control module 320) may, for example, compare delay caused by the delay test module 310 to a target delay. Such a target delay may be expressed in any of a variety of ways, including, for example, a time duration, a phase angle, a portion of a known time duration, a portion or multiple of the period of a periodic waveform, etc. The delay test module 310 (or delay control module 320) may then, for example, generate a signal indicative of the results of such a comparison. Such a generated signal may comprise an analog or digital signal (e.g., a binary or higher resolution signal).

In an exemplary scenario, the delay test module 310 may compare a difference in timing of a test signal 312 and corresponding delayed test signal to the duration of one cycle of a periodic signal to be delayed by the variable delay module 330. For example and without limitation, in a scenario where the variable delay module 330 is to delay a periodic input signal 332 by a portion or multiple of one cycle, the delay test module 310 may compare a difference in timing of a test signal 312 and corresponding delayed test signal to the duration of one cycle of the periodic input signal 332.

The delay control module 320 may, for example, modify the test delay control signal 318 to determine a test delay control signal 318 that results in the delay test module 310 delaying the test signal 312 by a target amount (or target range). Such a target amount may be, for example, an absolute value or relative value. For example and without limitation, a target amount may be expressed in terms of a portion or multiple of a periodic waveform. At least a portion of the delay characteristics determined by the delay test module 310 may then, for example, comprise information of the test delay control signal 318 that resulted in a delay of the test signal 312 by the target amount.

For example and without limitation, in an exemplary scenario, a target amount may be one cycle of a periodic signal to be delayed by the variable delay module 330. In such an exemplary scenario, the delay test module 310 may modify the test delay control signal 318 until it is determined that the delay caused by the delay test module 310 is substantially similar to the target one-cycle duration.

The delay control module 320 may generally determine a delay control signal 325 for the variable delay module 330 based at least in part on the delay characteristics determined by the delay test module 310. The delay control module 320 may, for example, determine a delay control signal 325, wherein the delay control signal 325 will cause the variable delay module 330 to delay an input signal 332 by a desired amount (e.g., target amount or range). For example, the delay control module 320 may determine a delay control signal 325 as a function of a test delay control signal 318 that was found to result in a target test delay for the delay test module 310.

For example, in an exemplary scenario where delay characteristics experimentally determined by the delay test module 310 comprise information of a test delay control signal 318 resulting in an experimental target delay in the delay test module 310, the delay control module 320 may determine a delay control signal 325 for the variable delay module 330 as a function of the ratio of desired delay in the variable delay module 330 to the experimental target delay.

The delay control module 320 may, for example, determine a delay control signal 325 for the variable delay module 330 as a function of the architecture of aspects of the variable delay module 330 compared to the architecture of aspects of the delay test module 310. For example and without limitation, a delay test module 310 may have a portion or multiplicity of delay circuitry as contained in the variable delay module 330. As a basic example, in a scenario where the variable delay module 330 comprises M variable delay elements, and the delay test module 310 utilizes N of such variable delay elements in series, the delay control module 320 may utilize knowledge of the M:N ratio in determining the delay control signal 325 for the variable delay module 330.

In general, the delay control module 320 may determine a delay control signal 325 based at least in part on experimentally determined delay characteristics determined by the delay test module 310. Accordingly, the scope of various aspects of the present invention should not be limited by characteristics of particular delays, particular delay control signals, a particular relationship between experimentally determined delay characteristics and particular delay control signals, or particular method or apparatus for processing delay control signals.

The variable delay module 330 may receive the input signal 332 and receive the delay control signal 325 from the delay control module 320. The variable delay module 330 may then process the input signal 332 by delaying the input signal 332 in accordance with the delay control signal 325.

The variable delay module 330 may then output the delayed input signal 334 to subsequent modules for further processing. For example and without limitation, subsequent signal processing module may utilize the delayed input signal 334 to control timing of further signal processing. A subsequent signal-processing module may, for example, utilize the delayed input signal 334 to form other signals (e.g., a clock signal or data timing signal). In general, subsequent signal processing modules may utilize the delayed input signal 334 to perform any of a large variety of signal processing activities. Accordingly, the scope of various aspects of the present invention should not be limited by characteristics of a particular subsequent signal processing modules or subsequent signal processing activities that utilize the delayed input signal 334.

Figure 4:
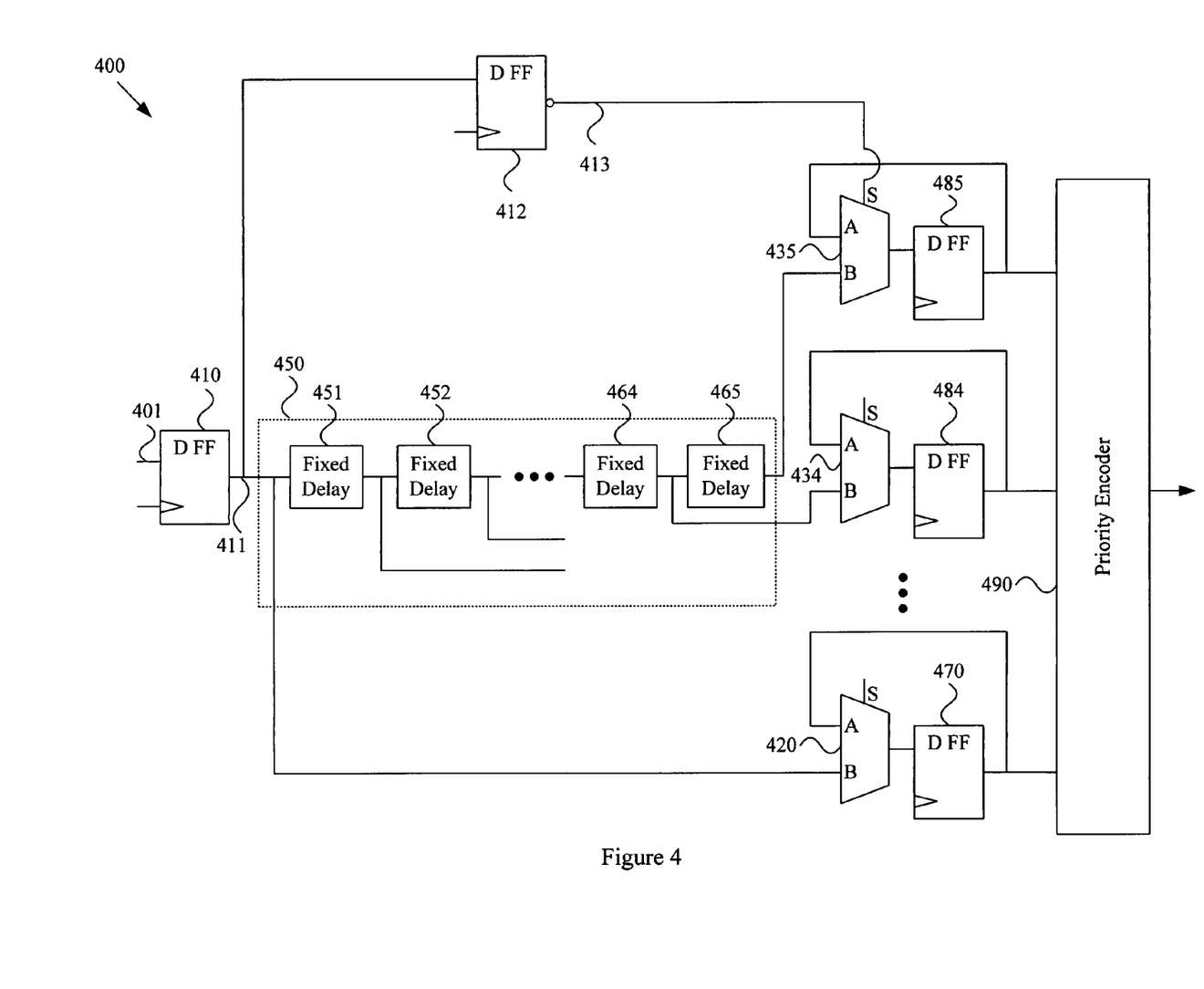
FIG. 4 is a diagram illustrating an exemplary system for determining circuit delay characteristics, in accordance with various aspects of the present invention.

FIG. 4 is a diagram illustrating an exemplary system 400 for determining circuit delay characteristics, in accordance with various aspects of the present invention. The exemplary delay system 400 or aspects thereof may, for example and without limitation, be utilized to implement various aspects of the methods 100, 200 shown in FIGS. 1-2 and discussed previously (e.g., steps 120 and 220) and/or may be utilized to implement various aspects of the delay test module 310 illustrated in FIG. 3 and discussed previously.

A test signal 401 may, for example, be applied to an input of a first D flip-flop 410 and get clocked into the first D flip-flop 410, appearing at the output 411 of the first D flip-flop 410. The signal provided at the output 411 of the first D flip-flop 410 may be applied to an input of a second D flip-flop 412. The inverting output 413 of the second D flip-flop 412 may then be provided to select inputs of multiplexers 420-435.

The test signal 401 clocked into the first D flip-flop 410 and provided at the output 411 of the first D flip-flop 410 may be applied to the input of a test delay sub-module 450. The test delay sub-module 450 may, for example, receive the signal 411 output from the first D flip-flop 410 and output a plurality of output signals.

The exemplary test delay sub-module 450 may comprise a plurality of serially connected fixed delay elements 451-465 (e.g., a chain of fifteen fixed delay elements). The fixed delay elements 451-465 may, for example, share various characteristics with variable delay elements utilized for other signal processing (e.g., fixed delay elements utilized in a variable delay module). Thus, determining delay characteristics of the fixed delay elements 451-465 may provide a reasonable prediction of the behavior of similar delay elements on the chip, particularly those in relatively close proximity to the fixed delay elements 451-465.

Figure 10:
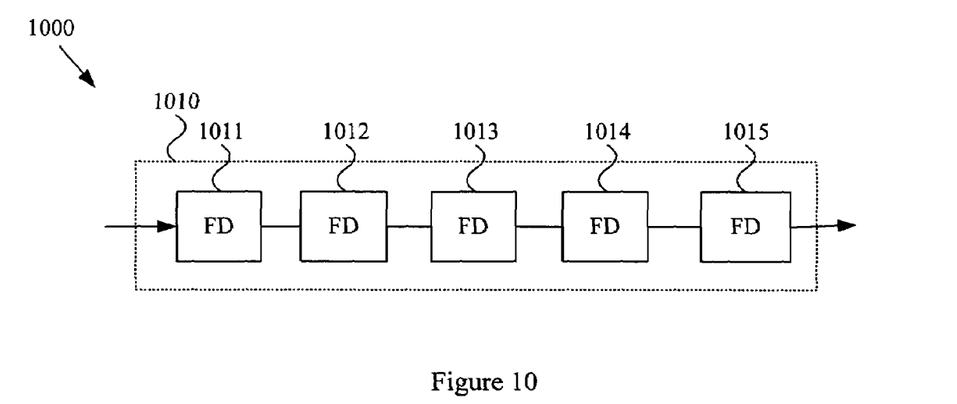
FIG. 10 is a drawing of an exemplary fixed delay element, in accordance with various aspects of the present invention.

In an exemplary scenario, the fixed delay elements 451-465 may each comprise a fixed delay element 1010 as illustrated in FIG. 10. The exemplary fixed delay element 1010 may, for example, comprise five serially linked fixed delay circuits 1011-1015. Also in the exemplary scenario, a variable delay circuit like the variable delay circuit 910 illustrated in FIG. 9 may be utilized. In such an exemplary scenario, each of the fixed delay elements 451-465 may comprise one or more (e.g., five) fixed delay circuits 1011-1015 that are identical to the fixed delay circuits 931-946 utilized in the variable delay circuit 910. Accordingly, fixed delay circuits in the test delay sub-module 450 may effectively serve as test proxies for the fixed delay circuits in the variable delay module. Note that varying numbers of identical fixed delay circuits may be utilized to obtain a desired level of delay resolution and/or to scale results of a delay test.

The output 411 of the first D flip-flop 410 may be applied to a B input of a first multiplexer 420. The respective outputs of the serially connected fixed delay elements 451-465 may be applied to respective B inputs of second-to-sixteenth multiplexers 421-435. Accordingly, in the exemplary system 400, the first multiplexer 420 may receive the signal 411 input to the test delay sub-module 450, the second multiplexer 421 may receive the signal 411 delayed by the first fixed delay element 451, the third multiplexer 422 may receive the signal 411 delayed by the first fixed delay element 451 and the second fixed delay element 452, and so on. The sixteenth multiplexer 435 may receive the signal 411 delayed by all fifteen fixed delay elements 451-465.

Respective outputs of each of the sixteen multiplexers 420-435 are coupled to inputs of respective output D flip-flops 470-485. The outputs of the respective D flip-flops 470-485 are coupled to the A inputs of the respective multiplexers 420-435. Also, as mentioned previously, the output 412 of the second D flip-flop 412 is coupled to the select inputs of the multiplexers 420-435. Accordingly, during a test duration, the output D flip-flops 470-485 are provided with respective delayed test signals output from the test delay sub-module 450 through their respective multiplexers 420-435. After a test duration, the output D flip-flops 470-485 are provided with their own respective output signals through their respective multiplexers 470-485, thus maintaining the results of the previous test.

During test operation, the outputs of the first flip-flop 410 and fixed delay elements 451-465 are coupled to respective D flip-flops 470-485 through their respective multiplexers 420-435. Each of the outputs of the fixed delay elements 451-465 are incrementally delayed relative to the previous fixed delay element. Accordingly, the output from the second fixed delay element 452 is delayed incrementally relative to the output from the first fixed delay element 451, the output from the third fixed delay element 453 is delayed incrementally relative to the output from the second fixed delay element 452, and so on.

In general operation, the test duration will last a time duration that is long enough to allow the input signal 411 to propagate through a portion of the fixed delay elements 451-465, but not all of the fixed delay elements 451-465, in time to get clocked into an output D flip-flop 471-485. The number of fixed delay elements 451-465 that the input signal 411 propagates through in time to be clocked into respective output D flip-flops 471-485 will generally be a function of the test duration and the amount of delay in the fixed delay elements 451-465. Accordingly, knowledge of the test time duration may be utilized to determine the delay behavior of the fixed delay elements 451-465.

The exemplary system 400 may comprise a priority encoder 490 that receives the outputs from the output D flip-flops 470-485 and outputs a digital value corresponding to the outputs of the output D flip-flops 470-485. The output of the priority encoder 490 is thus an indication of the delay characteristics of the fixed delay elements 451-465.

In an exemplary non-limiting scenario, the output of the priority encoder 490 may be utilized to control a variable delay module (e.g., as discussed previously regarding FIGS. 3 and 5). Also, for example, the output of the priority encoder 490 may be further analyzed to determine an appropriate control signal for a variable delay module.

Note that the circuit/system 400 illustrated in FIG. 4 is merely exemplary, and a variety of circuits may perform the general task(s) of the exemplary system 400 without departing from the spirit and scope of various aspects of the present invention. In general, a large number of circuits may be utilized to determine delay in a delay element. Accordingly, the scope of various aspects of the present invention should not be limited by characteristics of a particular exemplary circuit or system.

Figure 5:
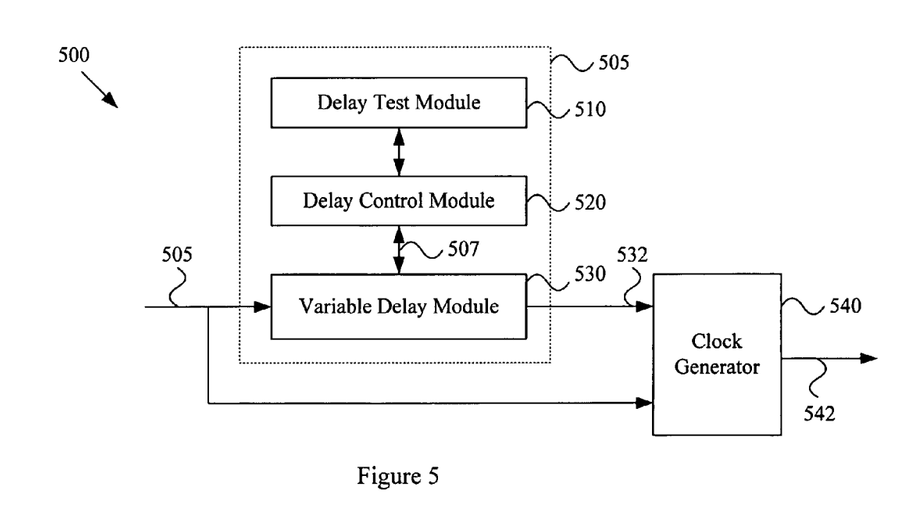
FIG. 5 is a diagram illustrating a clock generation module in an integrated circuit, in accordance with various aspects of the present invention.

FIG. 5 is a diagram illustrating a clock generation module 500 in an integrated circuit, in accordance with various aspects of the present invention. The exemplary clock generation module 500 may comprise a delay test module 510, delay control module 520, variable delay module 530, and a clock generator module 540.

The delay test module 510 may, for example and without limitation, comprise various aspects of the delay test module 310 of the system 300 illustrated in FIG. 3 and discussed previously. The delay test module 510 may, for example, experimentally determine delay characteristics of the variable delay module 530.

In an exemplary scenario, the delay test module 510 may experimentally determine delay characteristics of the variable delay module 530 by applying a plurality of test delay control signals to an on-chip test module to identify a particular test delay control signal that results in a desired delay. In another exemplary scenario, the delay test module 510 may experimentally determine a delay control signal that, when applied to the variable delay module 530, will result in a delayed input clock signal that is displaced from the input clock signal by ¼ cycle. In another exemplary scenario, the delay test module 510 may experimentally determine a number of fixed delay periods that occur during a test duration.

The delay control module 520 may, for example and without limitation, comprise various aspects of the delay control module 320 of the system 300 illustrated in FIG. 3 and discussed previously. The delay control module 520 may determine a delay control signal for the variable delay module 530. The delay control module 520 may, for example, determine such a delay control signal based at least in part on the delay characteristics determined by the delay test module 510.

The variable delay module 530 may, for example and without limitation, comprise various aspects of the variable delay module 330 of the system 300 illustrated in FIG. 3 and discussed previously. The variable delay module 530 may, for example, receive an input clock signal 505 (or timing signal) and delay the input clock signal 505 by an amount determined by a received delay control signal 507. The variable delay module 530 may then, for example, output a delayed input clock signal 532 comprising characteristics of the input clock signal 505 delayed by the amount determined by the delay control signal 507.

The clock generator module 540 (or timing signal generator) may, for example, receive the input clock signal 505 and the delayed input clock signal 532 output from the variable delay module 530. The clock generator module 540 may then, for example, process the input clock signal 505 and the delayed input clock signal 532 to generate an output clock signal 542. For example, the clock generator module 540 may generate an output clock signal 542 that comprises features of the input clock signal 505 and the delayed input clock signal 532. For example and without limitation, the variable delay module 530 may generate and output a clock signal 542 that is representative of the input clock signal 505 at twice the frequency of the input clock signal 505 and with transitions placed as a desired position relative to transitions of the input clock signal 505.

The clock generator module 540 may, for example, process the input clock signal 505 and the delayed input clock signal 532 utilizing combinational logic. Such combinational logic may, for example, comprise at least one of exclusive-OR logic and exclusive-NOR logic.

Figure 6:
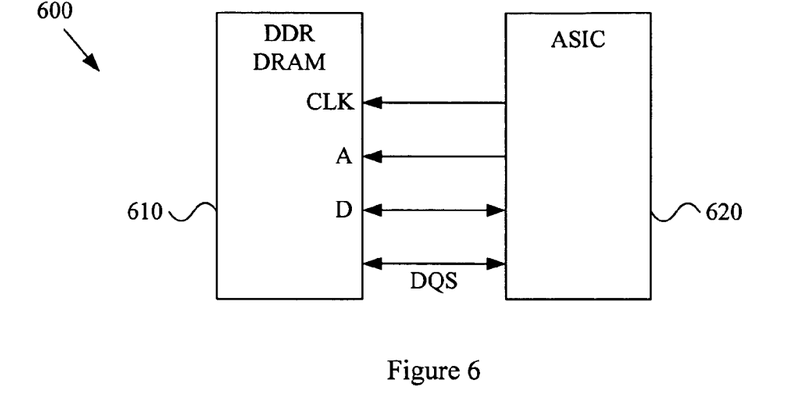
FIG. 6 is a diagram illustrating an exemplary system that may utilize signal tuning, in accordance with various aspects of the present invention.

FIG. 6 is a diagram illustrating an exemplary system 600 that may utilize signal tuning, in accordance with various aspects of the present invention. The exemplary system 600 may comprise a synchronous DRAM module 610 communicatively coupled to an ASIC 620. The synchronous DRAM module 610 may, for example, comprise a DQS port that returns a reclock signal (e.g., "DQS") along with the read data to inform the ASIC 620 that read data is coming and to provide an indication to the ASIC 620 of when the read data should be stable. The exemplary DRAM module 610 may, for example, comprise a Dual Data Rate ("DDR") RAM, which may transfer two pieces of data during the reclock cycle, the first piece during the high half of the clock cycle and the second piece during the low half of the clock cycle.

The exemplary system 600 of FIG. 6 will be used in the following discussion for illustrative purposes. It should be noted, however, that the exemplary system 600 is merely exemplary, and accordingly, the scope of various aspects of the present invention should not be limited by characteristics of the exemplary system 600 or any particular signal processing circuit.

Figure 7:
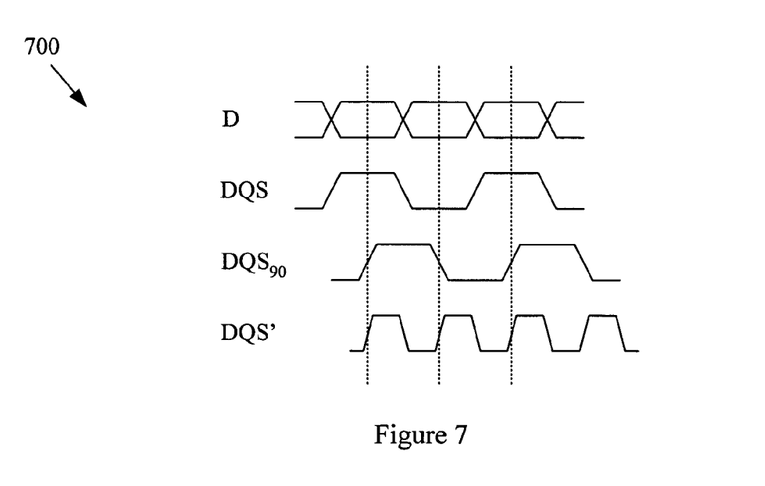
FIG. 7 is a diagram illustrating exemplary data and timing signals, in accordance with various aspects of the present invention.

FIG. 7 is a diagram 700 illustrating exemplary data and timing signals, in accordance with various aspects of the present invention. Note that the DQS strobe may be synchronized to the timing of data arriving from a DRAM. In various scenarios, it may be desirable to obtain a timing signal indicative of the center portion of a particular data window. However, the DQS signal may generally indicate timing at the beginning and end of data windows.

One way to construct such a desired signal may comprise creating a second DQS signal that is delayed by 90 degrees from the original DQS signal. An example of such a signal is presented in FIG. 7 and labeled "$DQS_{90}$." Signals DQS and $DQS_{90}$ may then be input to an XOR or XNOR gate to construct DQS' (or its inverse). As shown in FIG. 7, DQS' has transitions near the middle portion of corresponding data windows. Note that the DQS signal example is presented herein for illustrative purposes and should not limit the scope of various aspects of the present invention.

Obtaining the 90-degree phase shift may be performed in a variety of ways. Various circuits may, for example, incorporate a fixed delay element to shift or delay a signal a known and consistent amount. However, in various scenarios (e.g., in silicon of a high performance integrated circuit), implementing a fixed delay element may be impractical, for example from at least a manufacturing process control/consistency standpoint or from a standpoint of dynamic circuit behavior variance. For example, integrated circuit processing variation or operational condition variation may result in a delay element that is theoretically fixed being variable in practice. Accordingly, various aspects of the present invention may implement and utilize variable delay modules and elements to obtain a desired phase or temporal shift, and then tune such variable delay element(s) to obtain a desired delay for a signal.

Figure 8:
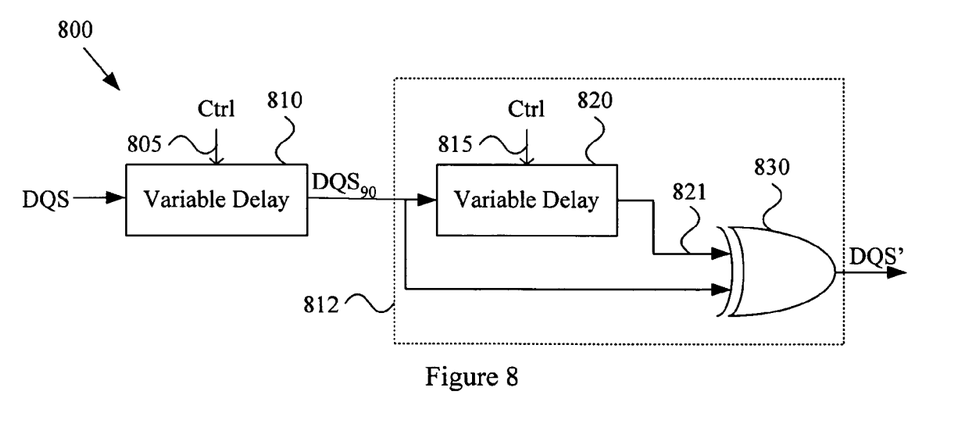
FIG. 8 is a diagram illustrating exemplary utilization of a variable delay element for data timing signal generation, in accordance with various aspects of the present invention.

FIG. 8 is a diagram illustrating an exemplary system 800 utilizing a variable delay element for data timing signal generation, in accordance with various aspects of the present invention. The exemplary system 800 or variation thereof may, for example, be utilized to generate the DQS' signal illustrated in FIG. 7. For example, the Ctrl signal 805 may direct the variable delay module 810 to perform a 90-degree phase shift on the input DQS signal, resulting in an output signal resembling $DQS_{90}$ shown in FIG. 7.

The $DQS_{90}$ signal may be provided to a signal generating module 812 (e.g., a clock generator or timing signal generator) that receives the $DQS_{90}$ signal and generates an output data timing signal (e.g., the DQS' signal) as a function of the $DQS_{90}$ signal. The exemplary signal generating module 812 may comprise a variable delay module 820 and an exclusive-OR gate 830.

The Ctrl signal 815 may direct the variable delay module 820 to perform a time delay to adjust pulse width of the output DQS' signal. The exclusive-OR gate 830 may receive the $DQS_{90}$ signal and the signal output 821 from the variable delay module 820 and process the input signals, resulting in the DQS' signal illustrated in FIG. 7. Note that the system 800 illustrated in FIG. 8 is merely an exemplary circuit to show how a variable delay module 810 may be utilized to process a timing signal. Accordingly, the scope of various aspects of the present invention should not be limited by characteristics of the exemplary system 800.

In summary, various aspects of the present invention provide a system and method for tuning a timing signal and for subsequent utilization of such a tuned timing signal. While the invention has been described with reference to certain aspects and embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A method for generating a data timing signal, the method comprising:
experimentally determining delay characteristics of an on-chip variable delay circuit utilizing an on-chip test module that is independent of the on-chip variable delay circuit;
determining a delay control signal, based at least in part on the experimentally determined delay characteristics;
receiving a first data timing signal at the on-chip variable delay circuit;
generating a second data timing signal utilizing the on-chip variable delay circuit to delay the first data timing signal according to the delay control signal; and
generating the data timing signal as a function of the first data timing signal and the second data timing signal.

2. The method of claim 1, wherein the first data timing signal is based on a timing signal from a synchronous memory device.

3. The method of claim 1, wherein experimentally determining delay characteristics comprises inputting a test signal to the on-chip test module at the beginning of a test duration, and processing the test signal with the on-chip test module to determine a number of fixed delay periods elapsed during the test duration.

4. The method of claim 1, wherein experimentally determining delay characteristics comprises applying a plurality of test delay control signals to the on-chip test module, and analyzing respective output signals from the on-chip test module to identify a particular test delay control signal.

5. The method of claim 1, wherein determining a delay control signal comprises determining a delay control signal that, when applied to the on-chip variable delay circuit, will result in the second data timing signal being offset from the first data timing signal by approximately an integer multiple of a quarter cycle of the first data timing signal.

6. A timing signal generation module in an integrated circuit, the timing signal generation module comprising:
a first module that receives an input data timing signal and delays the input data timing signal by an amount determined by a received delay control signal, and outputs the delayed input data timing signal;
a second module that experimentally determines delay characteristics of the first module;
a third module that determines a delay control signal based at least in part on the delay characteristics determined by the second module, and outputs the delay control signal to the first module; and
a fourth module that receives the input data timing signal and the delayed input data timing signal and generates an output data timing signal as a function of the input data timing signal and the delayed input data timing signal.

7. The timing signal generation module of claim 6, wherein the input data timing signal is based on a data timing signal from a synchronous memory device.

8. The timing signal generation module of claim 6, wherein the second module determines delay characteristics by inputting a test signal to an on-chip test module at the beginning of a test duration, and processing the test signal with the on-chip test module to determine a number of discrete delay periods that elapse during the test duration.

9. The timing signal generation module of claim 6, wherein the second module determines delay characteristics of the first module by applying a plurality of test delay control signals to the on-chip test module to determine a test delay control signal that causes the on-chip test module to delay a test signal by a target amount.

10. The timing signal generation module of claim 6, wherein the third module determines a delay control signal that, when applied to the first module, will result in the delayed input timing signal being offset from the input data timing signal by approximately an integer multiple of a quarter cycle of the input data timing signal.

11. The timing signal generation module of claim 6, wherein:
the first module comprises a variable delay module;
the second module comprises a delay test module;
the third module comprises a delay control module; and
the fourth module comprises a timing signal generator.

12. A method for adjusting the timing of a first signal in the integrated circuit, the method comprising:
experimentally determining delay characteristics of an on-chip variable delay circuit utilizing an on-chip test module independent of the on-chip variable delay circuit, wherein experimentally determining delay characteristics comprises:
inputting a test signal to the on-chip test module;
inputting a test control signal to the on-chip test module, the test control signal comprising a duration; and
processing the test signal with the on-chip test module to determine a number of discrete delay periods within the duration of the test control signal;
determining a delay control signal based at least in part on the experimentally determined delay characteristics; and
generating a delayed signal representative of the first signal delayed by an amount determined by the determined delay control signal.

13. The method of claim 12, further comprising receiving the first signal from a synchronous memory device.

14. The method of claim 12, wherein experimentally determining delay characteristics and determining a delay control signal are performed automatically when the integrated circuit is initialized.

15. The method of claim 12, wherein experimentally determining delay characteristics comprises:
inputting the test signal to the on-chip test module;
inputting a test delay control signal to the on-chip test module;
processing the test signal with the on-chip test module in accordance with the test delay control signal to produce a delayed test signal; and
modifying the test delay control signal to determine a test delay control signal that delays the test signal by a target amount.

16. The method of claim 12, wherein the on-chip test module is independent of the on-chip variable delay circuit and spatially positioned on the integrated circuit substantially near the on-chip variable delay circuit relative to other on-chip circuits.

17. The method of claim 12, wherein:
the on-chip test module comprises a test circuit fixed delay element; and
the on-chip variable delay circuit comprises a fixed delay element, wherein the test circuit fixed delay element and the variable delay circuit fixed delay element comprise substantially similar delay circuitry.

18. The method of claim 12, wherein the experimentally determined delay characteristics comprise information of a test delay control signal that experimentally resulted in the test signal being delayed a target amount through the on-chip test module.

19. The method of claim 12, wherein the delay control signal is determined as a function of a test delay control signal that results in a target delay for the on-chip test module.

20. The method of claim 12, wherein the delay control signal is determined as a function of a number of discrete delay periods that experimentally occur within a known interval.

21. A signal timing adjustment module in an integrated circuit, the signal timing adjustment module comprising:
  a first module that receives an input signal and generates a delayed signal representative of the input signal delayed by an amount determined by a received delay control signal;
  a second module that experimentally determines delay characteristics of the first module, wherein the second module comprises an on-chip test module and experimentally determines delay characteristics of the first module by performing processing comprising:
    inputting a test signal to the on-chip test module;
    inputting a test control signal to the on-chip test module, the test control signal comprising a duration; and
    processing the test signal with the on-chip test module to determine a number of discrete delay periods within the duration of the test control signal; and
  a third module that determines a delay control signal based at least in part on the delay characteristics determined by the second module, and outputs the delay control signal to the first module.

22. The signal timing adjustment module of claim 21, wherein the input signal comprises a synchronization signal from a synchronous memory device.

23. The signal timing adjustment module of claim 21, wherein the second module experimentally determines the delay characteristics of the first module, and the third module determines the delay control signal when the integrated circuit is initialized.

24. The signal timing adjustment module of claim 21, wherein the second module comprises an on-chip test module and experimentally determines delay characteristics of the first module by performing processing comprising:
  inputting the test signal to the on-chip test module;
  inputting a test delay control signal to the on-chip test module;
  processing the test signal with the on-chip test module in accordance with the test delay control signal to produce a delayed test signal; and
  modifying the test delay control signal to determine a test delay control signal that delays the test signal by a target amount.

25. The signal timing adjustment module of claim 21, wherein the second module is independent of the first module and spatially positioned on the integrated circuit substantially near the first module relative to other on-chip circuits.

26. The signal timing adjustment module of claim 21, wherein:
  the second module comprises a fixed delay element; and
  the first module comprises a fixed delay element, wherein the second module fixed delay element and the first module fixed delay element comprise substantially similar delay circuitry.

27. The signal timing adjustment module of claim 21, wherein the experimentally determined delay characteristics comprise information of a test delay control signal that experimentally resulted in the test signal being delayed a target amount through the on-chip test module.

28. The signal timing adjustment module of claim 21, wherein the third module comprises an on-chip test module, and determines the delay control signal as a function of a number of discrete delay periods that experimentally occur within a known interval.

29. The signal timing adjustment module of claim 21, wherein the third module comprises an on-chip test module, and determines the delay control signal as a function of a test delay control signal that results in a target delay for the on-chip test module.

30. The signal timing adjustment module of claim 21, wherein:
  the first module comprises a variable delay module;
  the second module comprises a delay test module; and
  the third module comprises a delay control module.

* * * * *